United States Patent [19]

Vaughn et al.

[11] Patent Number: 5,703,531
[45] Date of Patent: Dec. 30, 1997

[54] PREDISTORTION LINEARIZER AND METHOD EMPLOYING UNIPLANAR MAGIC T HYBRIDS

[75] Inventors: Steven A. Vaughn, Sun City; James A. Verkade, Lakewood, both of Calif.

[73] Assignee: Hughes Aircraft Company, Los Angeles, Calif.

[21] Appl. No.: 703,166

[22] Filed: Aug. 28, 1996

Related U.S. Application Data

[63] Continuation-in-part of Ser. No. 476,967, Jun. 7, 1995, abandoned.
[51] Int. Cl.[6] .................................................. H03F 1/32
[52] U.S. Cl. ........................................ 330/149; 455/63
[58] Field of Search ............................. 330/149; 375/296; 455/50.1, 63

[56] References Cited

U.S. PATENT DOCUMENTS 4,902,983  2/1990  Fujiki et al. ................... 330/149
5,304,944  4/1994  Copeland et al. ..

FOREIGN PATENT DOCUMENTS 179606  8/1986  Japan ............................. 330/149

*Primary Examiner*—James B. Mullins
*Attorney, Agent, or Firm*—P. Y. Price; T. Gudmestad; W. K. Denson-Low

[57] ABSTRACT

Operating on the principle of vector summation, a predistortion linearizer includes a signal divider on one side of a substrate plate that divides a microwave signal into a linear portion and a nonlinear portion. Signal energy on both the nonlinear and linear portions is coupled into two respective slotline transmission lines on the substrate by uniplanar Magic T hybrids. As the signals are transmitted along the slotlines, their relative amplitudes and phases are adjusted to introduce a distortion inverse to that expected in a subsequent amplification. The linear portion and nonlinear portion pass through another pair of baluns. The signals are then combined by an in-phase summation on the same side of the plate as the input signal divider.

18 Claims, 3 Drawing Sheets

PREDISTORTION LINEARIZER AND METHOD EMPLOYING UNIPLANAR MAGIC T HYBRIDS

This is a continuation-in-part of application Ser. No. 08/476,967, filed Jun. 7, 1995, now abandoned.

BACKGROUND OF THE INVENTION

This invention relates to electrical signal processing, and, more particularly, to the introduction of an inverse predistortion into a signal prior to a processing that distorts the signal.

Microwave devices are commonly used in communications systems. A familiar example is a satellite communications system in which microwaves are transmitted between earth and an orbiting satellite. Microwave devices are also widely used in earth communications systems.

The microwave signal is normally amplified prior to transmission. Although it is desired that the amplification be linear and independent of amplitude of the microwave signal, in practice no such ideal amplifiers are available. With real amplifiers, the amplification is nonlinear. To counteract and cancel the effects of the nonlinear amplification, it is common practice to intentionally distort the signal prior to amplification in a manner inverse to the distortion experienced in the amplifier. The effect of the nonlinear amplification of the predistorted signal is a linearly amplified signal, the desired result.

Several types of predistortion linearizers are known. Existing devices typically use relatively narrow band hybrid couplers such as branch line or ratrace couplers to split the signal power into two parallel signal paths, a nonlinear path and a linear path. The relative amplitude and phase of the two signal paths are adjusted to introduce the proper amount of predistortion before recombination in another hybrid coupler. These functions can be accomplished in a variety of ways. In one, unbalanced microstrip lines and coplanar waveguides are used. In another, balanced finline/waveguide circuits are employed, see for example U.S. Pat. No. 5,304,944, whose disclosure is incorporated by reference.

While operable, the prior predistortion linearizers have drawbacks. In some, the operating bandwidth is relatively narrow. Others require extensive circuitry such as a multiplicity of diodes to accomplish amplitude and phase adjustment, and are accordingly expensive to assemble, construct, and adjust. Yet others are relatively large in size and weight, a serious disadvantage if the predistortion linearizer is to be launched into orbit on board a satellite.

There is a need for a broad band, light weight, compact, and readily used predistortion linearizer that is suitable for a range of applications, including spacecraft applications. The present invention fulfills this need, and further provides related advantages.

SUMMARY OF THE INVENTION

The present invention provides a predistortion linearizer and a method for achieving predistortion linearization of signals, particularly microwave signals, prior to their further processing, as for example amplification. The approach of the invention provides a small, compact, light weight predistortion linearizer device, which adjustably tunes the signals as required for the desired predistortion. The device exhibits excellent broadband performance.

The predistortion linearizer of the invention includes a substrate which has electrical circuitry embodied in a metallization on a single side (uniplaner) of the substrate. A signal divider on the top side of the substrate acts on the input signal to divide it equally into each of two arms. The signal in each arm is conducted into identical but separate slotline transmission lines that compromise electrical circuitry formed on a side of the substrate. The input signal divider electrically resembles a waveguide magic T hybrid with two orthogonal inputs, E and H and two parallel outputs; but has the manufacturing advantages of microwave integrated circuitry (MIC). The E and H inputs are electrically isolated from each other by the difference between balanced and unbalanced transmission line characteristics. The phase difference in each of the two outputs depends on which of the two inputs are excited. The unbalanced E and H inputs to the device are implemented by two orthogonal coplanar transmission lines. The two outputs are realized by two slotlines (balanced lines). Microwave energy is coupled into each of the slotlines in phase with equal amplitude by exciting the E input arm. The output slotline transmission line is formed by etching a narrow gap or slot in the metallization on the top side of substrate. Signal energy travels down each of the two slotlines to the opposite end of the substrate where it is coupled back together by another magic T device. Here the signal outputs of the slotlines are summed 180° out of phase and extracted through the H port.

Stated alternatively, a predistortion linearizer comprises a dielectric plate substrate having a metallic layer on a single side thereof, and a linearizer signal input and a linearizer signal output on the same side of the plate substrate. A signal divider on the top side of the plate substrate has a signal divider input in electrical communication with the linearizer signal input, a signal divider output first leg, and a signal divider output second leg. A signal combiner on the top side of the plate substrate has a signal combiner input first leg, a signal combiner input second leg, and a signal combiner output in electrical communication with the linearizer signal output. A first slotline formed in the metallic layer on the top side of the plate substrate extends from a first slotline first end in registry with the signal divider output first leg to a first slotline second end in registry with the signal combiner input first leg. A second slotline formed in the metallic layer on the top side of the plate substrate extends from a second slotline first end in registry with the signal divider output second leg to a second slotline second end in registry with the signal combiner input second leg.

There is, additionally, means for adjusting the relative phase and amplitude of signals transmitted along the two slotlines. This means preferably includes a Schottky limiter diode and a PIN diode attenuator operating on each of the slotlines.

The slotlines are arranged in relation to the signal divider and the signal combiner so as to accomplish a 180° phase reversal of one of the signals, preferably the nonlinear signal, and no phase reversal of the other signal, when the signals are combined. Electrical communication without phase reversal is accomplished by achieving registry of the slotline from the same side of the signal divider output leg and the signal combiner input leg. Electrical communication with phase reversal is accomplished by selecting an orthogonal port (E or H) of the output hybrid with respect to the input hybrid.

The invention also extends to a method of performing a predistortion linearization of a signal, comprising the steps of dividing the signal into a linear portion and a nonlinear portion, transmitting the linear portion along a first slotline, transmitting the nonlinear portion along a second slotline, adjusting the relative phase and amplitude of the linear portion and the nonlinear portion as they are transmitted along the first slotline and the second slotline, and combining the linear portion and the nonlinear portion 180° out of phase.

The device according to the present invention is effective over a broad bandwidth to accomplish predistortion linearization. It is compact and light, and is readily constructed from a relatively small number of components. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
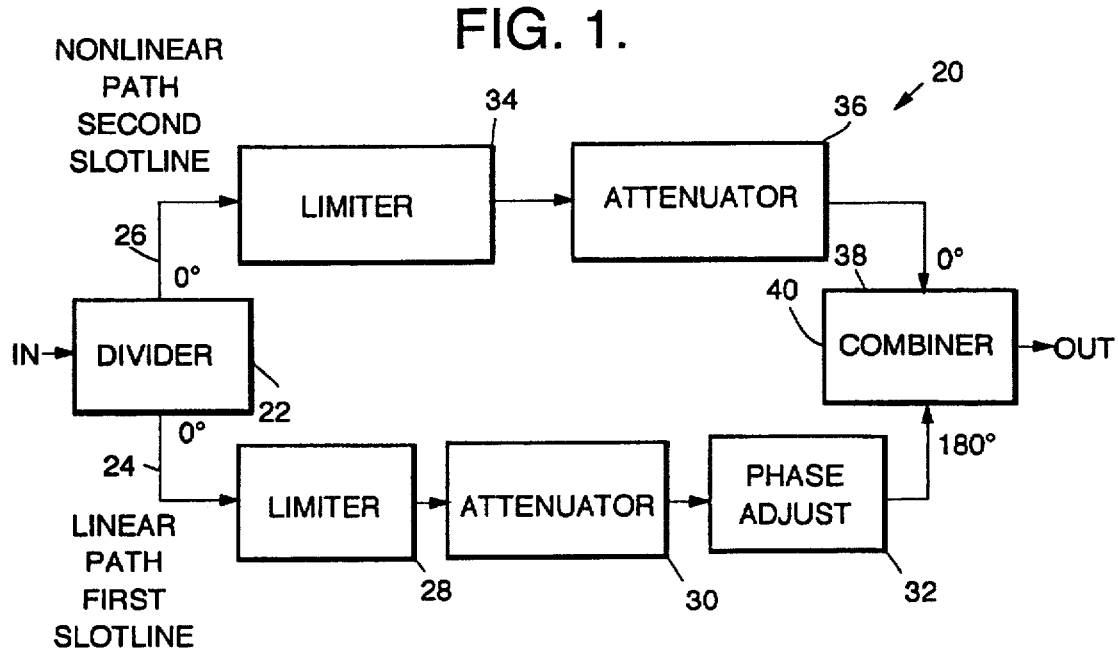
FIG. 1 is a schematic circuit diagram of a predistortion linearizer.

FIG. 1 depicts a schematic circuit diagram of a preferred predistortion linearizer 20 according to the invention. An input signal is divided by a divider 22 into a nonlinear portion with a 0° phase offset and a linear portion with a 0° phase offset. The linear portion is fed to a first slotline waveguide 24 and the nonlinear portion is fed to a second slotline waveguide 26. The linear portion in the first slotline 24 is supplied to a variable limiter 28, thereafter to a variable attenuator 30, and thereafter to a variable phase adjuster 32. The nonlinear portion in the second slotline 26 is supplied to a variable limiter 34, and thereafter to a variable attenuator 36. The linear portion in the first slotline 24 and the nonlinear portion in the second slotline 26 are combined in a combiner 38, with a 180° phase offset. The output of the combiner 38 is supplied to an amplifier or other device (not shown). The elements 28, 30, 32, 34, and 36 are controlled to introduce the appropriate predistortion into the final output signal, as required for the characteristics of the downstream amplifier or other device.

Figure 3:
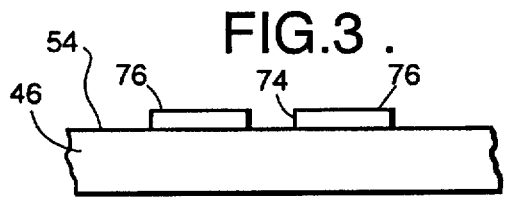
FIG. 3 is a sectional view through the device of FIG. 2, taken along lines 3—3.
Figure 2:
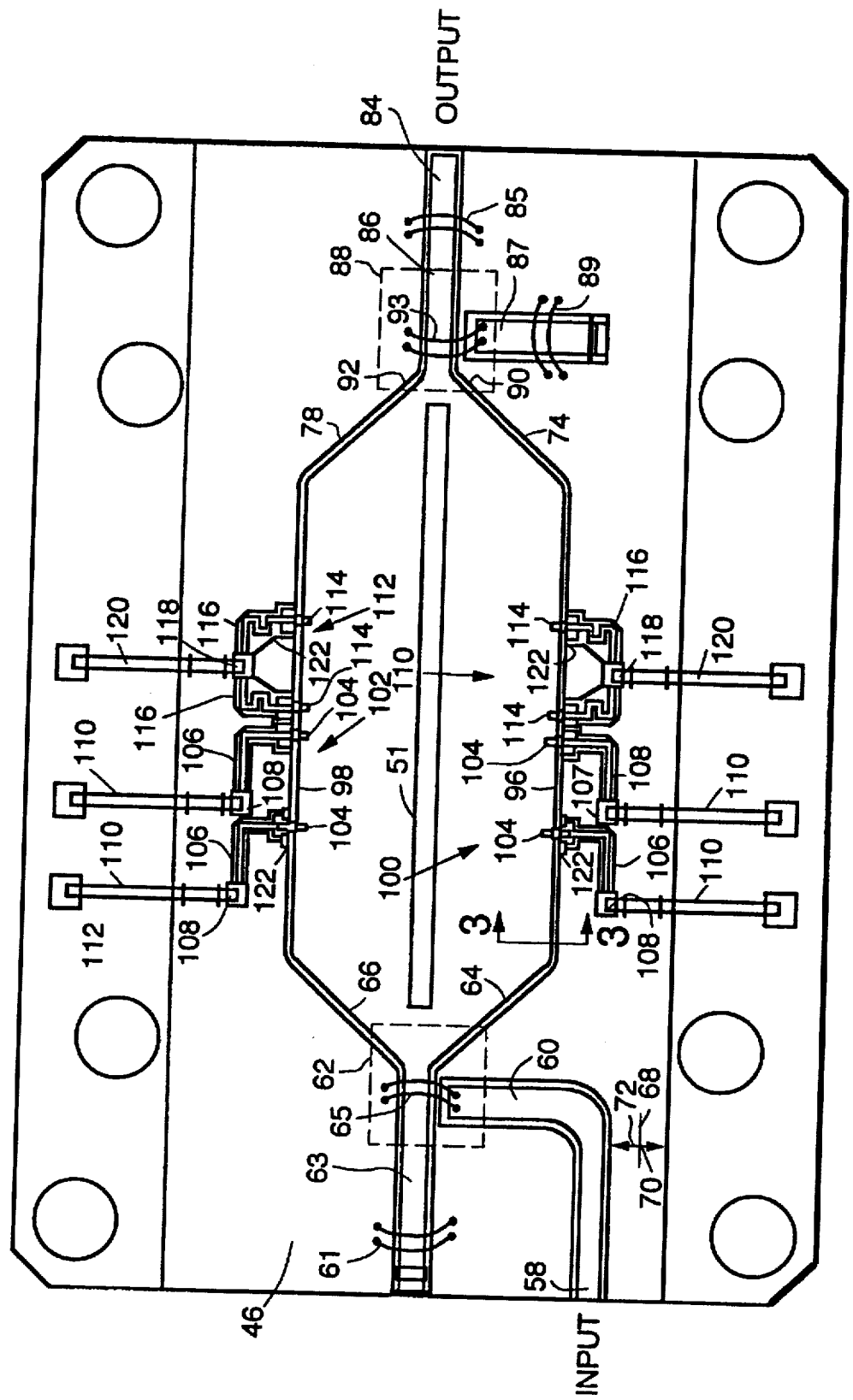
FIG. 2 is a schematic view of the device of FIG. 1, showing the structure of the top side of the substrate.
Figure 5:
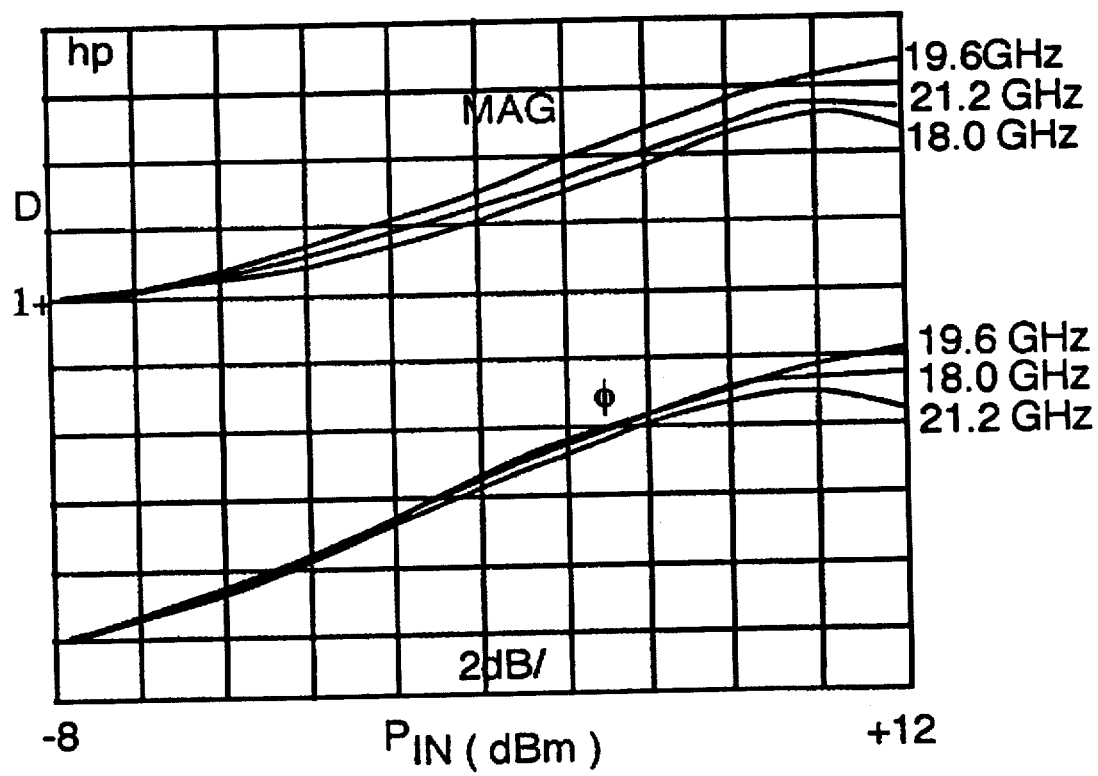
FIG. 5 is a graph the desired of gain and phase dispersion of a predistortion linearizer constructed according to the invention.

FIGS. 2 and 3 depict a preferred physical arrangement of a predistortion linearizer 50 which implements the principles of FIG. 1. The predistortion linearizer 50 is fabricated on an individual dielectric plate substrate 46. The substrate 46 is preferably made of aluminum oxide or other ceramic insulator. The substrate 46 thickness is preferably from about 0.005 inches to about 0.025 inches. A septum 51 suppresses spurious wave modes between the linear arm and nonlinear circuitry to avoid electrical interaction between signals in the slotlines formed thereon. FIG. 2 is a schematic view showing the circuit elements on the top side on substrate 46. The structure and functioning of the predistortion linearizer is most readily discussed sequentially from the signal input to the signal output.

The predistortion linearizer 50 has a linearizer signal input 58. The input 58 communicates with a signal divider input 60 of a signal divider 62. A signal divider 62 is formed by an input coplanar line section 60 ("E arm"), metal airbridges 61 and 65, a coupled slotline section 63 ("H arm"), and two output slotlines 66 and 64. The signal divider 62 splits the power of the input signal into two equal components on a signal divider output first leg 64 and a signal divider output second leg 66. The preferred signal divider 62 is a broadband uniplanar magic T hybrid, as illustrated, but any operable in-phase power divider may be used. The first leg 64 and the second leg 66 are parallel to each other and to a longitudinal axis 68 of the plate substrate 46. A first transverse direction 70 is perpendicular to the longitudinal axis 68 and lies in the plane of the plate substrate 46. A second transverse direction 72 is perpendicular to the longitudinal axis 68 and lies in the plane of the plate substrate 46, and is opposite to the first transverse direction 70.

A first slotline 64 is formed on the top side of the substrate 46. The slotline 64 is a low-profile waveguide that is formed onto metallic plating on the substrate by conventional patterning and etching procedures well known in the microelectronics field. As seen in FIG. 3, a thin layer 76 of a metal such as gold is deposited upon the surface of the top side of the substrate 46. The layer 76 may be just as laterally extensive as necessary to accommodate the formation of the slotline, as shown in FIG. 3, or it may be more extensive if a metallic layer is required elsewhere on the substrate. The layer 76 is patterned by standard techniques and etched to form a channel that serves as the slotline waveguide. A second slotline 66 is formed in the same manner.

The predistortion linearizer 50 has a linearizer signal output 84 on the top side of substrate 46, which is positioned at the opposite end of the substrate 46 from the input 58. A signal combiner 88 is formed by two input slotline line sections 90 and 92, metal airbridges 85, 89, and 93, a coupled slotline section 87 ("E arm"), and an out put coplanar line 84. The output 84 communicates with a signal combiner output 86 ("H arm") of a signal combiner 88. The signal combiner 88 combines the power of two separate inputs of a signal combiner input first leg 90 and a signal combiner input second leg 92. The preferred signal combiner 88 is a broadband uniplanar magic T power divider (combiner), as illustrated, but any operable out-of-phase power divider may be used. The first leg 90 and the second leg 92 are parallel to each other and to the longitudinal axis 68 of the plate substrate 46.

Power is conveyed to the combiner inputs 90 and 92 by the respective slotlines 74 and 78. Power introduced into the slotlines at their respective first ends is transmitted along the lengths of the slotlines to their respective second ends, and is there transferred from the slotlines to the respective input legs by electromagnetic coupling.

Between their respective first and second ends, the slotlines 74 and 78 follow a parallel path that permits them to intersect the inputs and outputs in the manner described, to permit coupling of signal-modifying devices to the signals in the slotlines. These signal-modifying devices are all positioned on the top side 46 of the substrate, FIG. 2.

A first limiter 100 is coupled to the signal in the first slotline 74, and a second limiter 102 is coupled to the signal in the second slotline 78. The limiters 100 and 102 each preferably comprise at least one, and preferably two, Schottky limiter diodes 104. The limiter diodes 104 are DC biased through quarter-wave lines 106 terminated with capacitors 108 having external connections 110. The limiters are controlled by application of DC-voltages to the external connections 110.

An attenuator 111 is coupled to the signal in the first slotline 74, and a second attenuator 112 is coupled to the signal in the second slotline 78. The attenuators 111 and 112 each preferably comprise at least one, and preferably two, PIN diode attenuators 114. The PIN diode attenuators 114 are DC biased through quarter-wave lines 116 terminated with capacitors 118 having external connections 120. The PIN diode attenuators are controlled by application of DC-voltages to the external connections 120.

Beam lead capacitors 122 are positioned adjacent to the slotlines 64, 66, 74 and 78 to provide radio frequency continuity through the DC isolated diodes along the top of each slotline.

Tuning of the two slotlines 74 and 78 is accomplished by adding metal foil (not shown) as necessary over the respective slotline, or by adding dielectric "pucks" (not shown) in the respective slotline 74 or 78.

Figure 4:
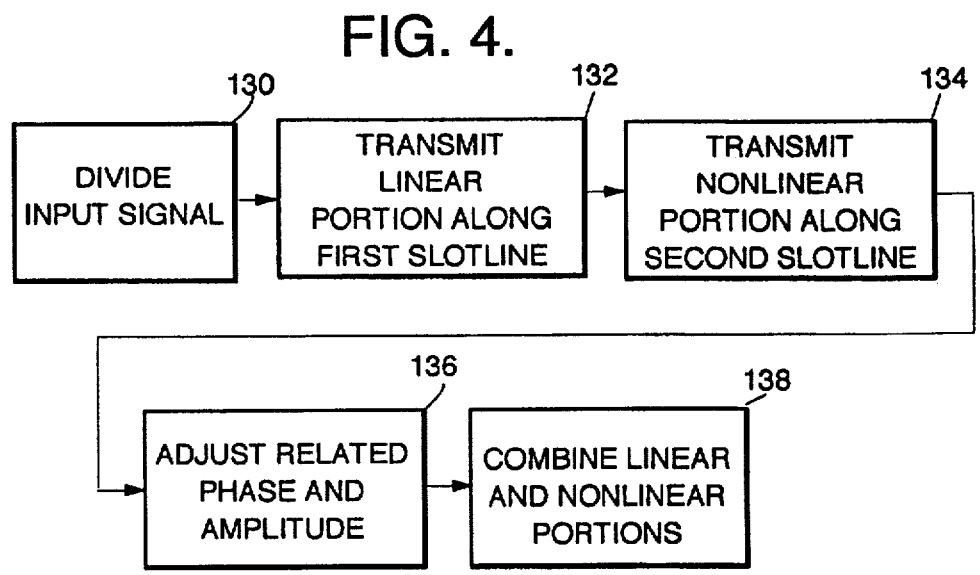
FIG. 4 is a block diagram of a method for performing predistortion linearization.

FIG. 4 depicts a method for performing predistortion linearization of a signal. An input signal is divided, numeral 130 into linear and nonlinear portions. The linear portion is transmitted along a first slotline, numeral 132, and the nonlinear portion is transmitted along a second slotline, numeral 134. The relative phase and amplitude of the linear and nonlinear portions are adjusted, numeral 136. The linear and nonlinear portions are then combined, numeral 138, with a 180° phase reversal of the linear portion. The method depicted in FIG. 4 may be performed with any operable apparatus, but the predistortion linearizers 20 and 50 are preferred.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A predistortion linearizer, comprising:

a dielectric plate substrate having a metallic layer on a single side thereof, the plate having a longitudinal axis lying in the plane of the plate and a transverse axis lying in the plane of the plate and perpendicular to the longitudinal axis, there being a first transverse direction and an oppositely disposed second transverse direction perpendicular to the longitudinal axis;

a signal divider on a top side of the plate substrate, the signal divider having a signal divider input, a signal divider output first leg parallel to the longitudinal axis, and a signal divider output second leg parallel to the longitudinal axis;

a signal combiner on the top side of the plate substrate, the signal combiner having a signal combiner input first leg parallel to the longitudinal axis, a signal combiner input second leg parallel to the longitudinal axis, and a signal combiner output;

a first slotline formed in the metallic layer on the top side of the plate substrate, the first slotline representing the signal divider output first leg in the first transverse direction and representing the signal combiner input first leg in the first transverse direction; a second slotline formed in the metallic layer on the top side of the plate substrate, the second slotline representing the signal divider output second leg in the second transverse direction and representing the signal combiner input second leg in the first transverse direction; and means for adjusting the relative phase and amplitude of signals transmitted along the first slotline and the second slotline.

2. The predistortion linearizer of claim 1, wherein the signal divider comprises uniplanar a Magic T power divider and the signal combiner comprises uniplanar a Magic T power divider.

3. The predistortion linearizer of claim 1, wherein the means for adjusting comprises a first means for adjusting the phase and amplitude of a first signal transmitted along the first slotline, and a second means for adjusting the phase and amplitude of a second signal transmitted along the second slotline.

4. The predistortion linearizer of claim 1, wherein the means for adjusting comprises a Schottky limiter diode and a PIN diode attenuator.

5. The predistortion linearizer of claim 1, wherein the means for adjusting comprises a first Schottky limiter diode pair and a first PIN diode pair coupled to the first slotline, and a second Schottky limiter diode pair and a second PIN diode pair coupled to the second slotline.

6. The predistortion linearizer of claim 1, wherein the dielectric plate substrate is made of aluminum oxide and the metallic layer is made of gold.

7. A predistortion linearizer, comprising:

a dielectric plate substrate having a metallic layer on a top side thereof;

a linearizer signal input and a linearizer signal output on a top side of the plate substrate;

a signal divider on the top side of the plate substrate, the signal divider having a signal divider input in electrical communication with the linearizer signal input, a signal divider output first leg, and a signal divider output second leg;

a signal combiner on the top side of the plate substrate, the signal combiner having a signal combiner input first leg, a signal combiner input second leg, and a signal combiner output in electrical communication with the linearizer signal output;

a first slotline formed through the metallic layer on the top side of the plate substrate and extending from a first slotline first end in registry with the signal divider output first leg to a first slotline second end in registry with the signal combiner input first leg;

a second slotline formed through the metallic layer on the top side of the plate substrate and extending from a second slotline first end in registry with the signal divider output second leg to a second slotline second end in registry with the signal combiner input second leg; and means for adjusting the relative phase and amplitude of signals transmitted along the first slotline and the second slotline.

8. The predistortion linearizer of claim 7, wherein each of the first slotline first end registry with the signal divider output first leg, the first slotline second end registry with the signal combiner input first leg, the second slotline first end registry with the signal divider output second leg, and the second slotline second end registry with the signal combiner input second leg comprises a collinear registry.

9. The predistortion linearizer of claim 7, wherein the sense of registries are selected such that one of the first slotline and the second slotline achieves no phase reversal of a signal transmitted along the slotline and the other of the first slotline and the second slotline achieves a 180° phase reversal of a signal transmitted along the slotline.

10. The predistortion linearizer of claim 7, wherein the first slotline reaches registry from the same sides of the signal divider output first leg and the signal combiner input first leg, and wherein the second slotline reaches registry from opposite sides of the signal divider output second leg and the signal combiner input second leg.

11. The predistortion linearizer of claim 7, wherein the signal divider comprises a Magic T power divider and the signal combiner comprises a Magic T power divider.

12. The predistortion linearizer of claim 7, wherein the means for adjusting comprises a first means for adjusting the phase and amplitude of a first signal transmitted along the first slotline, and a second means for adjusting the phase and amplitude of a second signal transmitted along the second slotline.

13. The predistortion linearizer of claim 7, wherein the means for adjusting comprises a Schottky limiter diode and a PIN diode attenuator.

14. The predistortion linearizer of claim 7, wherein the means for adjusting comprises a first Schottky limiter diode pair and a first PIN diode pair coupled to the first slotline, and a second Schottky limiter diode pair and a second PIN diode pair coupled to the second slotline.

15. The predistortion linearizer of claim 7, wherein the dielectric plate substrate is made of aluminum oxide and the metallic layer is made of gold.

16. A method of performing a predistortion linearization of a signal, comprising the steps of:

providing a planar substrate having a first slotline and a second slotline thereon;

dividing the signal into a linear portion and a nonlinear portion using a Magic T power divider;

transmitting the linear portion along the first slotline;

transmitting the nonlinear portion along the second slotline;

adjusting the relative phase and amplitude of the linear portion and the nonlinear portion as they are transmitted along the first slotline and the second slotline; and combining the linear portion and the nonlinear portion 180° out of phase.

17. The method of claim 16 of performing a predistortion linearization wherein the step of combining comprises using a Magic T power combiner.

18. The method of claim 16, wherein the step of providing a planar substrate includes the step of providing the Magic T power divider on the planar substrate.

\* \* \* \* \*